United States Patent [19]

Smith

[11] 4,037,307
[45] July 26, 1977

[54] METHODS FOR MAKING TRANSISTOR STRUCTURES

[75] Inventor: George Elwood Smith, Murray Hill, N.J.

[73] Assignee: Bell Telephone Laboratories, Incorporated, Murray Hill, N.J.

[21] Appl. No.: 738,532

[22] Filed: Nov. 3, 1976

Related U.S. Application Data

[63] Continuation-in-part of Ser. No. 560,590, March 21, 1975, abandoned, which is a continuation-in-part of Ser. No. 485,962, July 5, 1974, abandoned.

[51] Int. Cl.² .............................................. B01J 17/00
[52] U.S. Cl. ........................................ 29/571; 29/578; 29/591; 357/23
[58] Field of Search .......................... 29/571, 578, 591; 357/23

[56] References Cited

U.S. PATENT DOCUMENTS 3,514,844  6/1970  Bower ...................................... 29/571
3,699,646  10/1972  Vadasz ...................................... 29/571

OTHER PUBLICATIONS

Neues Aus Der Technik, Feb. 1972, vol. 1, pp. 1 & 2, "Preparation of Semiconductor Components with Narrow Semiconducting Regions, etc.".

Primary Examiner—W. Tupman
Attorney, Agent, or Firm—Irwin Ostroff

[57] ABSTRACT

In one embodiment, an extremely short channel FET is made by forming a metal layer over a wafer, depositing silicon dioxide over part of the metal layer, oxidizing the exposed metal, controllably etching a portion of the silicon dioxide to expose a small strip of the nonoxidized metal layer, electroplating the exposed metal strip, thereby to form an extremely narrow gate electrode, removing the deposited SiO$_2$, the metal oxide and the remaining metal layer to leave only the gate electrode, and using the gate electrode as a mask for ion implanting source and drain regions. Since the gate electrode can be made so narrow, the channel region is correspondingly short to give extremely high frequency capabilities. Other embodiments are also described.

10 Claims, 16 Drawing Figures

METHODS FOR MAKING TRANSISTOR STRUCTURES

CROSS-REFERENCE TO RELATED APPLICATION

This application is a continuation-in-part of the copending application Ser. No. 560,590 filed Mar. 21, 1975 and assigned to Bell Telephone Laboratories, Incorporated, now abandoned, which is a continuation-in-part of Ser. No. 485,962 filed July 5, 1974, assigned to Bell Telephone Laboratories, Incorporated, and now abandoned.

BACKGROUND OF THE INVENTION

This invention relates to methods for making transistor structures, and more particularly, to methods for making transistors having impurity regions separated by extremely small lateral distances.

Because of its ease of fabrication, the field effect transistor (FET) is finding widespread use in integrated circuit technology. The most common FET is one using source and drain regions on the surface of a silicon wafer separated by a channel region through which current is controlled by a gate electrode overlying the channel region and insulated from it by a thin layer of silicon dioxide. These devices lend themselves to large scale integrated circuit fabrication techniques because all of the source and drain regions can be made by simultaneous impurity diffusions or implantations, and relatively large packing densities can be achieved. One drawback is that their electronic speed of operation is limited by the difficulty of making a short channel over which a gate electrode can be accurately registered.

A device that is structurally related to the FET is the lateral bipolar transistor is which emitter and collector regions on the surface of a wafer are separated by a short base region. The applicability of these devices are limited by the difficulty in making a sufficiently short base region on the surface of the wafer.

SUMMARY OF THE INVENTION

I have found that short channel FETs, and bipolar transistors having short base regions, can be made by using an edge of a semiconductor mask as a reference location for defining an extremely short lateral distance. Various techniques will be described by which the edge of a first mask is used to determine a first impurity region, and as a reference location for a second mask, the second mask having a second edge a short lateral distance from the first impurity region. This second edge is then used to define a second impurtiy region remoed a short lateral distance from the first impurity region. The closely spaced impurity regions define a short channel region of an FET or a short base region in a lateral bipolar transistor.

A specific embodiment for implementing this principle is succinctly described in the Abstract of the Disclosure and will not be repeated. A significant consequence of that particular technique is that the gate electrode is inherently accurately registered over the extrememly short channel region. Another consequence is that the device is susceptible to mass production and to large scale integrated circuit techniques so that arrays of high speed FETs can be made on a single semiconductor chip.

Other embodiments, objects, features and advantages of the invention will be better understood from a consideration of the following description taken in conjunction with the accompanying drawing.

DRAWING DESCRIPTION

DETAILED DESCRIPTION

Figure 1:
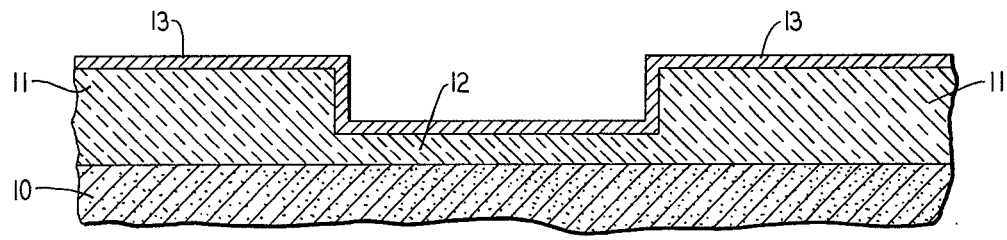
FIGS. 1 through 4 are schematic sectional views of a semiconductor wafer showing various steps in the formation of a transistor in accordance with an illustrative embodiment of the invention.

FIGS. 1 through 4 illustrate a process for making a short-channel FET in accordance with an illustrative embodiment of the invention. Referring to FIG. 1, the transistor is made in a silicon wafer 10 upon which a thick layer 11 of silicon dioxide, known in the art as the field layer, has been thermally grown, and upon which a thin layer 12, known as the gate oxide layer, has also been thermally grown. As is well understood in the art, it is presupposed that a large number of FETs are made simultaneously on the wafer 10. In accordance with one embodiment of the invention, a metal layer 13, which may typically be aluminum, having a thickness of 2,000 Angstroms, is deposited over the oxide, as by evaporation.

Figure 2:
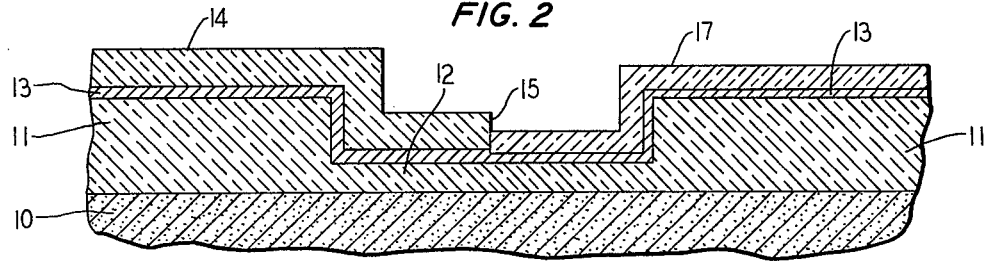

Referring to FIG. 2, a layer of silicon dioxide is deposited on the wafer. The silicon dioxide layer is then selectively masked and the unmasked areas thereof are then etched away. Notice that becuase of the mask, the layer 14 has an edge 15 which lies roughly in the middle of the gate oxide layer 12. The deposited layer 14 covers part of metal layer 13 and leaves part of it exposed. Next, the exposed portion of the metal layer is oxidized, as by anodization, to form a metal oxide layer 17, in this case aluminum dioxide. Because aluminum dioxide is of greater bulk than aluminum, the oxidation constitutes a growth of the layer 17 at the expense of part of metal layer 13 so that an edge of the metal oxide layer 17 abuts against edge 15 as shown.

Next, the wafer surface is exposed to an etchant that selectively etches the surface of the silicon dioxide. The silicon dioxide layer is exposed to the etchant only for a time sufficient to move the edge of the layer 14 from position 15 to position 15' as shown. This lateral movement in the location of edge 15' can be made extremely short with high accuracy due to the high predictability of the etch rate of silicon dioxide. For example, the wafer may be exposed for a predetermined time to buffered hydrofluoric acid, which etches at a rate of 1,100 Angstroms per minute, thus yielding a predictable lateral distance between edges 15 and 15'.

Figure 4:
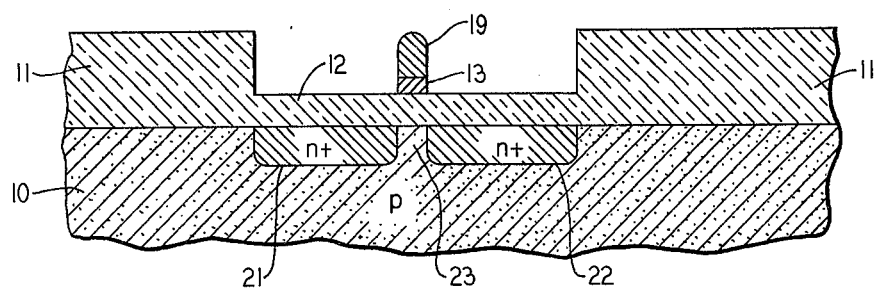

The partial etching of oxide layer 14 leaves an extremely small surface 18 of the nonoxidized metal layer 13 which is exposed. The wafer is then placed in an appropriate solution for plating a metal onto surface 18 to form an electrode 19 (FIG. 4). Because surface 18 is the only portion of the exposed wafer which is metallic, that is the only location on which the metal may be plated. Electrode 19 may be nickel which is deposited by electrodes plating on aluminum surface 18. A variety of other metals could be used using electroplating methods and it is also possible to plate aluminum on aluminum using a nonaqueous solution.

Figure 3:
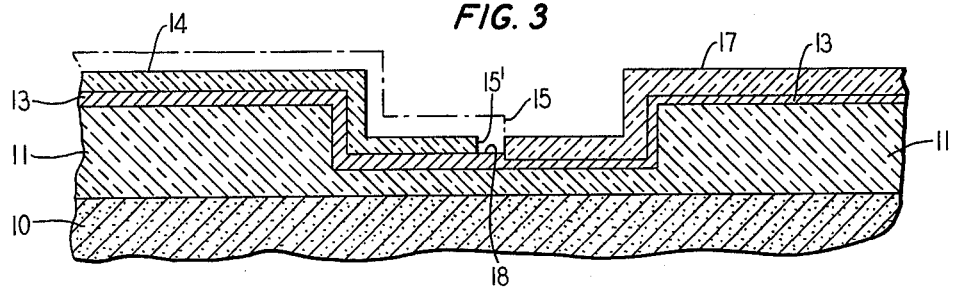

Referring to FIG. 4 the electroplating process therefore results in an extremely narrow gate electrode 19 which has been plated on the surface 18 of FIG. 3. The next step is to remove by selective etching the metal oxide layer 17, the silicon dioxide layer 14 and metal layer 13 (except that covered by 19) to expose again oxide layers 11 and 12. Source and drain regions 21 and 22 are then formed in wafer 10 by ion implantation using gate electrode 18 and field oxide later 11 as ion implantation masks.

Ion implantation is a process which is well understood in the art and is not believed to require significant elucidation. Impurity ions such as phosphorus are projected toward the wafer, penetrate the gate oxide layer 12, and may subsequently be diffused to form regions 21 and 22. It is well known that a metal strip such as electrode 19 and a thick silicon dioxide layer such as layer 11 will act as effective masks to give selective penetration only through the gate oxide layer 12 as shown. That is, the ions are projected with sufficient energy to penetrate gate oxide layer 12, but insufficient energy to penetrate electrode 19 or field oxide layer 11.

Notice that the proximity of source and drain regions 21 and 22 defines a channel region 23 between them, the length of which is dictated by the width of gate electroce 19. Gate electrode 19 in turn may virtually be made as thin as desired, the only limitation being the control with which oxide layer 14 of FIG. 3 can be selectively etched back. Because this selective etch can be made to within submicron tolerances, channel 23 of FIG. 4 can likewise have submicron dimensions, with the gate electrode 19 inherently being accurately registered with the channel. Diffusion of source and drain regions 21 and 22 subsequent to ion implantation can, as is known, also be used to control the locations of junction boundaries and thus the channel length. Moreover, a large array of such field effect transistors can be made simultaneously in a single wafer as is desired for making high speed switching systems, logic circuits, memory systems and the like.

Typical thicknesses of the various layers are as follows. The gate oxide layer 12 may be between 50 and 2,000 Angstroms thick, with 150 Angstroms being one example. The field oxide layer 11 should typically be ten times the gate oxide layer thickness. The aluminum layer 13 may have a thickness of up to 2 microns, typically 2,000 Angstroms. If the desired channel length is, say, 0.25 micron, layer 14 may be 1 micron thick initially, and then etched back 0.25 micron. As is known, thinner gate oxide layer thicknesses generally require higher substrate doping levels. The p-type substrate may typically be doped to $3 \times 10^{17}$ carriers/cm$^3$ with the $n+$ source and drain regions being at $10^{19}$ carriers/cm$^3$.

Figure 5:
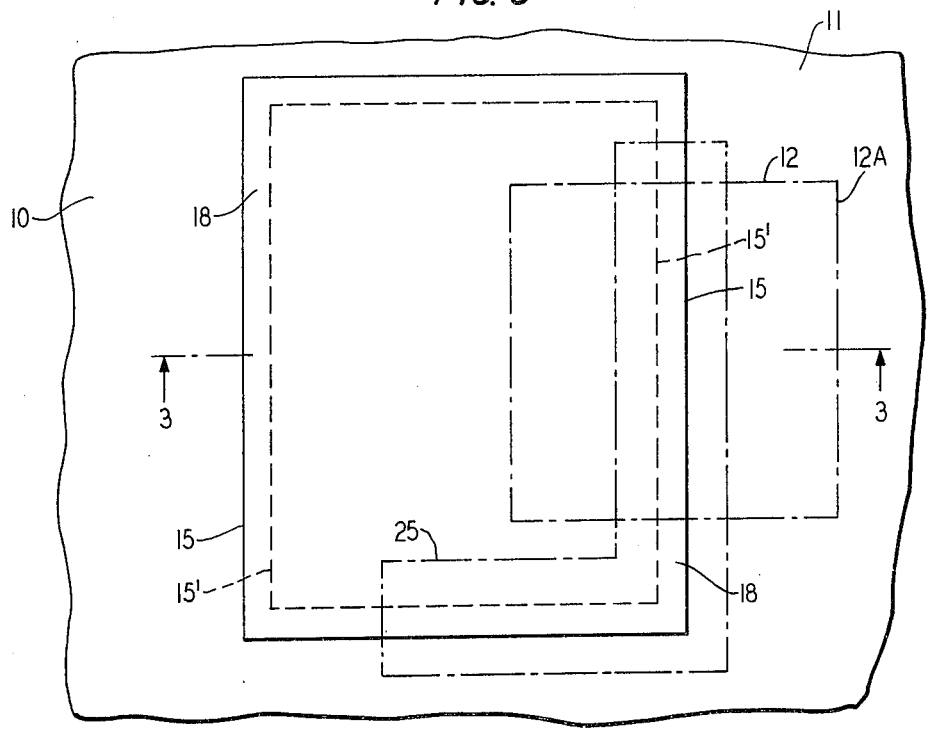
FIGS. 5 and 6 are plan views of the transistor of FIGS. 1 through 4 at different stages of fabrication.
Figure 6:
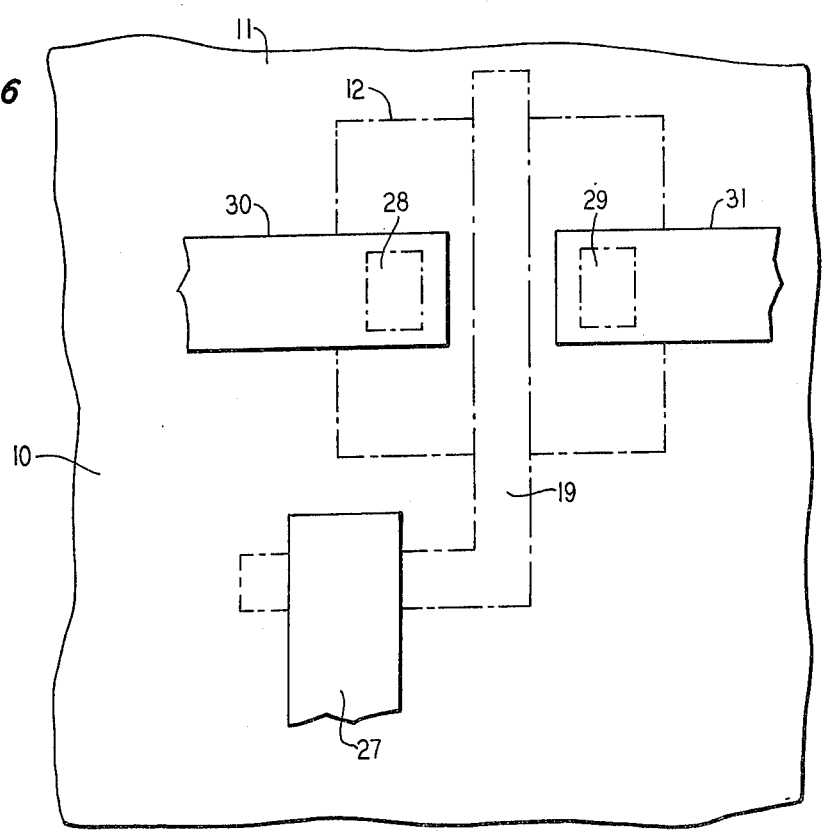

For circuit operation, the source gate and drain must of course be separately and accurately contacted by metal conductors. FIGS. 5 and 6, which are plan views of the wafer 10 at different stages of fabrication illustrate one method of accomplishing this. FIG. 5, which may be taken as essentially a plan view of FIG. 3, illustrates the thin oxide region 12 by the boundary line 12A which separates it from the field oxide region 11. Boundary 15 corresponds to the edge 15 of FIG. 2 of the deposited oxide 14. After the etch-back, the edge or boundary is moved to the location shown at 15'. This exposes the metallic surface 18 having the shape of a hollow square. In order to produce a convenient configuration of the gate electrode, the wafer is covered with photoresist having an L-shaped opening 25. Thus, gate electrode metal is electroplated on surface 18 only in the area within L-shaped opening 25.

Referring to FIG. 6, this leads to an L-shaped gate electrode 19 which is conveniently contacted by a gate conductor 27. Openings 28 and 29 are etched through the thin gate oxide layer 12 to expose source and drain regions 21 and 22 of FIG. 4. These in turn are respectively contacted by metal conductors 30 and 31 which constitute the source and drain electrodes.

Figure 7:
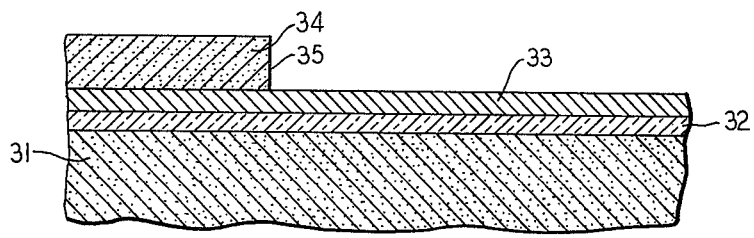
FIGS. 7 through 10 are schematic sectional views of a semiconductor wafer showing various stages of the fabrication of a transistor in accordance with another embodiment of the invention.
Figure 8:
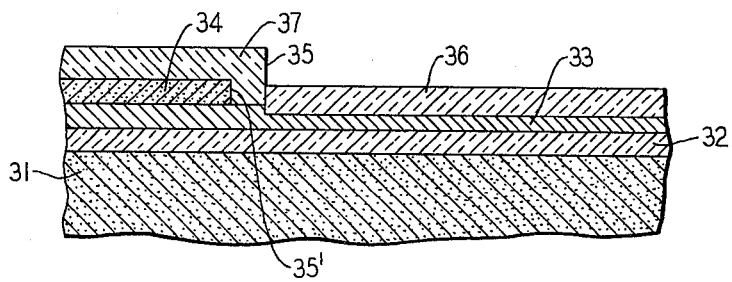

FIGS. 7 through 10 illustrate an alternative technique for defining the narrow channel region. Referring to FIG. 7, a wafer 31 is covered with layers of silicon dioxide 32 and aluminum 33. A layer of polysilicon 34 is deposited having an edge 35 which defines one boundary of the channel region as before.

Figure 9:
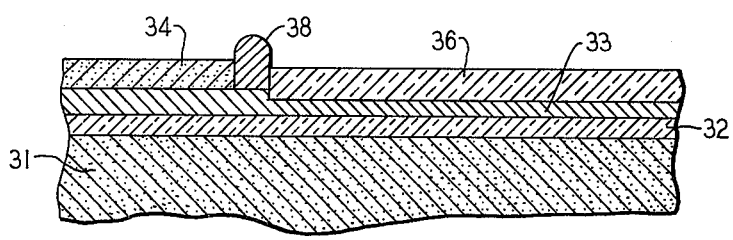
Figure 10:
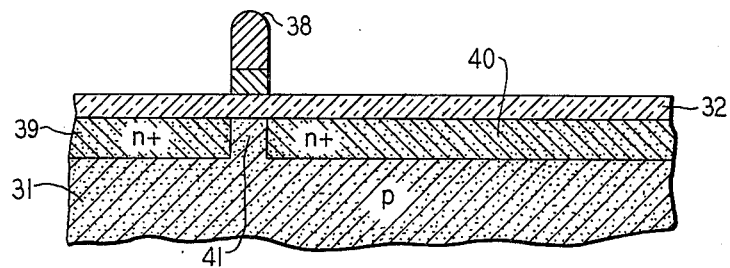

The exposed aluminum is anodized to form an aluminum oxide layer 36 which abuts against edge 35. The silicon layer 34, however, is also oxidized to form a silicon dioxide layer 37. The advantage of forming this layer 37 is that it can easily be selectively dissolved and its depth is accurately determinable. Thus, the wafer is next exposed to a solvent of SiO$_2$ which removes layer 37 to define an edge 35'. As before, this exposes a small surface of the aluminum upon which a gate electrode 38 can be electroplated, as shown in FIG. 9. Referring to FIG. 10, layers 33, 34 and 36 are removed and gate electrode 38 is used as a mask for defining source and drain regions 39 and 40 separated by a short channel region 41, as before.

The silicon dioxide layer 37 is preferably made by anodization, rather than thermal oxidation, of the polysilicon layer 34. This may be done before, simultaneously with, or after the anodization of the aluminum layer 33. The aluminum oxide layer 36 is preferably sintered at 450° C to make it more resistant to buffered HF, assuming buffered HF is used to etch selectively the silicon dioxide layer 37. The temperatures required for anodization and sintering are both sufficiently low to avoid undersirable diffusion of aluminum into silicon.

It is clear that the structure of either FIG. 4 or FIG. 10 could alternatively be used as a bipolar transistor in that the source and drain regions could be considered as emitter and collecter regions separated by a short base region. Such transistors, known as lateral bipolar transistors, have certain recognized advantages over the more conventional vertical bipolar transistor which uses an emitter diffusion into the base region. Alternative methods for making lateral bipolar transistors are shown in FIGS. 11 through 13 and 14 through 16.

Figure 11:
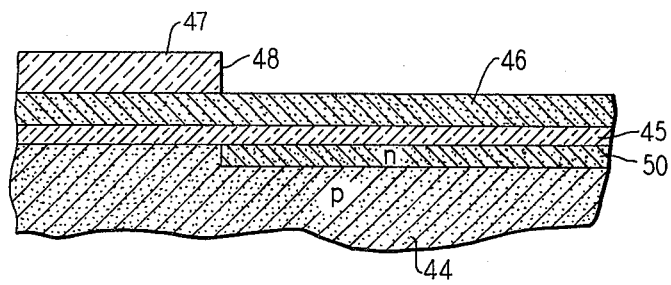
FIGS. 11 through 13 illustrate still another embodiment of the invention.

Referring to FIG. 11, a p-type wafer 44 is covered with a thin layer of silicon dioxide 45 and a deposited silicon layer 46. A silicon nitride mask 47 having an edge 48 is deposited over layer 46 using conventional masking techniques. The layer 47 then acts as a mask during ion implantation of an n-type collector region 50.

Figure 12:
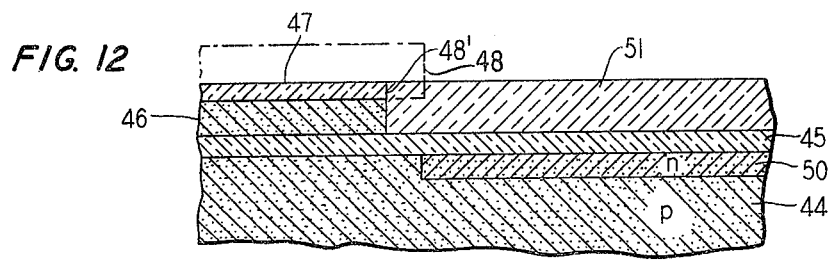

Referring to FIG. 12, the silicon nitride layer 47 is next exposed to a selective etch which moves the edge of the layer 47 to location 48', a short lateral distance from the diffused collector region 50. Next, the silicon layer 46 of FIG. 11 is oxidized to form a silicon dioxide layer 51 which abuts against edge 48'. As is known, silicon nitride may be selectively etched at 70-80 Angstroms per minute by a 160° C solution of H$_3$PO$_4$.

Figure 13:
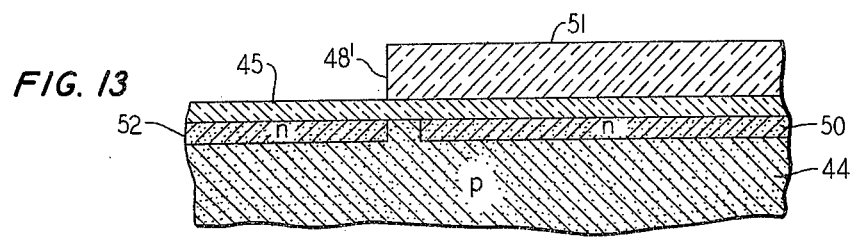

Referring to FIG. 13, the silicon nitride layer 47 is next removed by a selective etch, as is the remaining silicon layer 46 of FIG. 12. This leaves only the thin oxide layer 45 and the thick silicon dioxide layer 51 having an edge 48' corresponding to the same displaced location shown in FIG. 12. Using layer 51 as a mask, emitter region 52 is then defined by ion implantation, it being appropriately displaced from collector region 50 by a distance corresponding to the lateral displacement of edges 48 and 48' of FIGS. 11 and 12. Since there is no automatic registration of a gate electrode, this process is favored for making a lateral bipolar transistor rather than an FET. However, a reregistered gate could be applied to make an FET.

Figure 14:
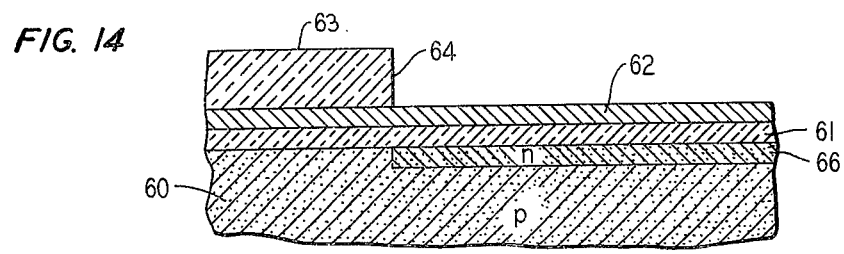
FIGS. 14 through 16 illustrate still another embodiment of the invention.
Figure 15:
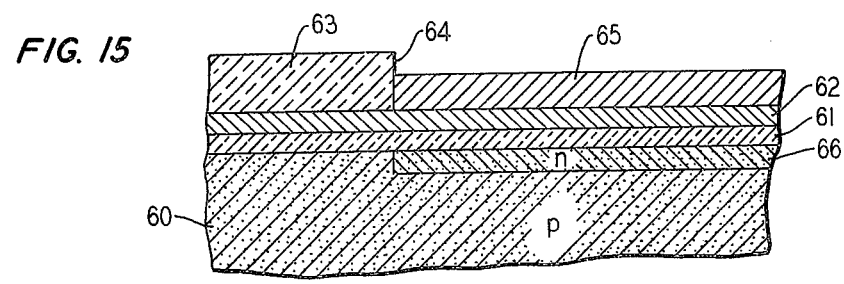
Figure 16:
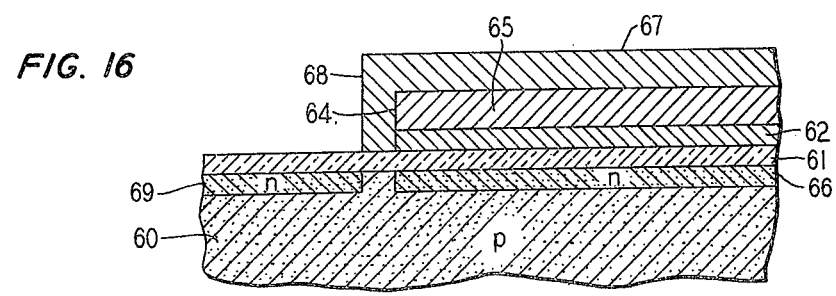

Referring to FIGS. 14 through 16, still another method of making a lateral bipolar transistor in a wafer 60 is illustrated. First a thin oxide layer 61 and a thin metal layer 62 are formed. Next, a thick layer of deposited silicon dioxide 63 having a mask edge 64 is deposited. An ion implantation step using layer 63 as a mask forms an n-type collector region 66. Thereafter, another layer of metal 65 is deposited, as by electroplating, only on the exposed surface of metal layer 62.

Referring to FIG. 16, since layer 65 abutted against silicon dioxide layer 63 it has an edge 64. The silicon dioxide layer 63 and exposed metal layer 62 are selectively dissolved so that the only exposed metal is layer 65. Next, another metal layer 67 is selectively formed on metal layer 65, as by electroplating or by an electroless process. Metal deposited by electrochemical plating forms a layer of uniform thickness, and thus, the edge 68 of layer 67 is displaced a small predictable distance from edge 64. The emitter region 69 is then formed by ion implantation using edge 68 to define its lateral extent. The thickness of metal layer 67 of course defines the distance between emitter 69 and collector 66, and again, this distance may be made very small and with great accuracy. Layer 62 is preferably a very thin layer of tungsten. Layer 65 is preferably electroplated nickel and layer 67 is preferably nickel plated by electroless deposition. Tungsten may be selectively etched by a solution comprising 0.1 molar potassium ferricyanide ($K_3FeCN_6$), 0.25 molar $KH_2PO_4$ and 0.23 molar KOH.

The foregoing embodiments are to be considered as merely illustrative of the inventive concepts. The various materials and their corresponding etchants are illustrative of various such materials, as are the conductivities and implant processes. Diffusion could be used in certain instances rather than ion implantation and it may be used in conjunction with ion implantation. Various other embodiments and modifications may be made by those skilled in the art without departing from the spirit and scope of the invention.

What is claimed is:

1. A method for making transistors comprising the steps of:
    forming over a semiconductor substrate a first mask (e.g., 14) having an exposed portion including a first vertical edge (e.g., 15) and then thereafter controllably removing a portion of the exposed surface of the first mask, including the portion of the first mask which defines the first vertical edge, to define a second vertical edge (e.g., 15') laterally removed a controlled distance from the location of the first edge;
    forming over the semiconductor substrate a second mask having a first vertical edge at a location corresponding to the location of the first vertical edge of the first mask and having a second vertical edge at a location corresponding to the location of the second vertical edge of the first mask, said second mask being characterized in that it inhibits impurities from passing therethrough; and
    forming in the semiconductor substrate first and second separate impurity regions, the first impurity region being formed at a location defined by the first edge of the second mask and the second impurity region being formed at a location defined by the second edge of the second mask.

2. The method of claim 1 further comprising the steps of:
    forming a metal layer (e.g., 13) over the substrate prior to forming the first mask;
    oxidizing that portion of the metal layer not covered by the first mask prior to removing a portion of the first mask, whereby the step of defining the second edge exposes part of the metal layer (e.g., 18); and
    depositing a metal (e.g., 19) such that the deposited metal adheres only to the exposed part of the metal layer.

3. The method of claim 2 wherein:
    the impurity regions are formed by ion implantation; and
    the deposited metal is used as an ion implantation mask.

4. The method of claim 3 wherein;
    the first mask is a layer of silicon deposited on part of the metal layer; and
    the metal layer is aluminum.

5. The method of claim 3 wherein: the first mask comprises a layer of silicon and the removing step comprises the step of controllably oxidizing part of the silicon layer to form silicon dioxide and selectively etching said silicon dioxide.

6. A method for making a field effect transistor comprising the steps of:
    forming a metal layer over a semiconductor surface;
    forming a first mask on the wafer surface such that an edge thereof overlies the metal layer;
    oxidizing the exposed metal layer such that metal oxide abuts the first mask edge;
    controllably removing part of the first mask such that the edge of the first mask is moved to create a small gap between the first mask and the metal oxide which exposes a portion of the metal layer;
    depositing metal on the wafer surface such that the metal adheres only to the exposed metal layer, thereby forming a second metal mask;
    removing the first mask; and
    using opposite edges of the second metal mask to define first and second impurity regions located in the semiconductor wafer.

7. The method of claim 6 wherein:
    the first mask is removed prior to the formation of any impurity regions;
    the second metal mask has an edge corresponding to the location of this first mask edge; and
    the first and second impurity regions are formed in the wafer simultaneously by ion implantation.

8. A method for making a field-effect transistor comprising the steps of:
    forming a thick oxide layer over a semiconductor wafer surface;
    forming a plurality of discrete thin oxide regions on the wafer surface;

forming a metal layer over the thick and thin oxide regions;

depositing a relatively thick material layer over part of each thin oxide region, thereby covering part of the metal layer;

oxidizing the exposed metal layer, thereby forming a metal oxide layer that abuts the thick material layer;

etching uniformly a predetermined part of the deposited material layer, thereby to expose a part of the nonoxidized metal layer;

depositing metal on the wafer surface such that it adheres only to the exposed metal, thereby to form a gate electrode over each thin oxide region;

removing the deposited material layer;

projecting by ion implantation impurities toward said wafer, said impurities having insufficient energy to penetrate the gate electrodes, whereby the gate electrodes act as implantation masks to define source and drain regions; and making metal contacts to each of the source and drain regions and gate electrodes.

9. The method of claim 8 wherein:

the wafer is of silicon;

the thick and thin oxide layers are made by thermal oxidation of the silicon; and the deposited material layer is deposited $SiO_2$.

10. The method of claim 8 wherein the deposited material layer is silicon, part of which is subsequently oxidized.

* * * * *